(12) United States Patent
Kodaira

(10) Patent No.: US 10,777,473 B2
(45) Date of Patent: Sep. 15, 2020

(54) SEMICONDUCTOR DEVICE

(71) Applicant: FUJI ELECTRIC CO., LTD., Kanagawa (JP)

(72) Inventor: Yoshihiro Kodaira, Shenzhen (CN)

(73) Assignee: FUJI ELECTRIC CO., LTD., Kanagawa (JP)

( * ) Notice: Subject to any disclaimer, the term of this patent is extended or adjusted under 35 U.S.C. 154(b) by 24 days.

(21) Appl. No.: 16/228,814

(22) Filed: Dec. 21, 2018

(65) Prior Publication Data

US 2019/0157171 A1 May 23, 2019

Related U.S. Application Data

(63) Continuation of application No. PCT/JP2017/044258, filed on Dec. 8, 2017.

(30) Foreign Application Priority Data

Jan. 17, 2017 (JP) ................... 2017-006123

(51) Int. Cl.
*H01L 23/02* (2006.01)
*H01L 23/051* (2006.01)
(Continued)

(52) U.S. Cl.
CPC .......... *H01L 23/051* (2013.01); *H01L 23/10* (2013.01); *H01L 23/142* (2013.01); *H01L 23/49811* (2013.01); *H01L 23/49838* (2013.01)

(58) Field of Classification Search
CPC ......... H01L 23/49811; H01L 23/49838; H01L 23/051; H01L 23/10; H01L 23/142
(Continued)

(56) References Cited

U.S. PATENT DOCUMENTS 5,763,946 A 6/1998 Nakadaira
6,597,585 B2 7/2003 Ferber
(Continued)

FOREIGN PATENT DOCUMENTS

JP H0515445 U 2/1993
JP H0945831 A 2/1997
(Continued)

OTHER PUBLICATIONS

International Search Report for International Patent Application No. PCT/JP2017/044258, issued by the Japan Patent Office dated Feb. 20, 2018.

*Primary Examiner* — Luan C Thai

(57) ABSTRACT

Provided is a semiconductor device having: a terminal portion having a through hole is formed on a principal surface portion; and a casing portion in which an opening to make the principal surface portion of the terminal portion exposed is provided, wherein the opening has a corner portion corresponding to a corner of the principal surface portion of the terminal portion, wherein the casing portion has a thick portion, in which thickness of a resin may be greater than that of a middle portion between adjacent corner portions across two sides forming the corner portion, in a surrounding area of the opening. Furthermore, a slit portion extending outward from the corner portion may be formed in the casing portion. At least a part of the outline of the slit portion as viewed from the upper surface direction of the casing portion may be curved.

13 Claims, 14 Drawing Sheets

(51) Int. Cl.
*H01L 23/498* (2006.01)
*H01L 23/14* (2006.01)
*H01L 23/10* (2006.01)

(58) Field of Classification Search
USPC .......................................................... 257/678
See application file for complete search history.

(56) References Cited

U.S. PATENT DOCUMENTS

| | | | |
|---|---|---|---|
| 6,774,468 B2 * | 8/2004 | Ogawa | .............. H01L 23/49861 |
| | | | 257/678 |
| 8,933,554 B2 * | 1/2015 | Kodaira | .................. H01L 23/34 |
| | | | 257/584 |
| 8,975,740 B2 * | 3/2015 | Hone | .................... H01L 25/072 |
| | | | 257/693 |
| 2004/0070066 A1 | 4/2004 | Ogawa | |
| 2013/0285231 A1 | 10/2013 | Kodaira | |
| 2013/0334676 A1 | 12/2013 | Kodaira | |
| 2015/0061105 A1 | 3/2015 | Oose | |

FOREIGN PATENT DOCUMENTS

| | | | |
|---|---|---|---|
| JP | 2004134569 | A | 4/2004 |
| JP | 2013008619 | A | 1/2013 |
| JP | 2015053301 | A | 3/2015 |
| WO | 2012124209 | A1 | 9/2012 |
| WO | 2013015031 | A1 | 1/2013 |

\* cited by examiner

SEMICONDUCTOR DEVICE

The contents of the following Japanese patent application(s) are incorporated herein by reference:
NO. 2017-006123 filed in JP on Jan. 17, 2017, and
PCT/JP2017/044258 filed on Dec. 8, 2017.

BACKGROUND

1. Technical Field

The present invention relates to a semiconductor device.

2. Related Art

Conventionally, in a semiconductor device housing a semiconductor chip and the like, known is semiconductor device having a terminal portion; a resin casing portion having an opening exposing a principal surface portion of the terminal portion: and a nut glove which is inserted so as to be below the terminal portion, and fix the terminal portion (for example, see Patent Document 1).

PRIOR ART DOCUMENT

Patent Document

Patent Document 1: WO No. 2013/015031

SUMMARY

In the semiconductor device, when the terminal portion is assembled to the nut glove, the terminal portion having received the fastening torque is inclined or moved to apply a force to the surrounding resin casing in some cases. Therefore, it is desirable to increase the intensity of the casing portion around the terminal portion and to prevent breakage of the casing portion beforehand.

A first aspect of the present invention provides a semiconductor device. The semiconductor device may include a terminal portion and a casing portion. In the terminal portion, a through hole may be formed on a principal surface portion. In the casing portion, an opening may be provided. The opening may have the principal surface portion of the terminal portion exposed. The opening may have a corner portion. The corner portion may correspond to a corner of the principal surface portion of the terminal portion. The casing portion may have a thick portion in a surrounding area of the opening. In the thick portion, thickness of a resin may be greater than that of a middle portion between adjacent corner portions across two sides forming the corner portion.

The casing portion may have a bottom portion, a lid portion, and an insertion portion. In the bottom portion, a semiconductor chip may be mounted. In the bottom portion, the terminal portion may be fixed. The lid portion may cover at least a part of the bottom portion. The opening to make the principal surface portion of the terminal portion exposed may be provided. The insertion portion may be inserted between the principal surface portion of the terminal portion and the bottom portion in the opening of the lid portion. The insertion portion may have a fitting surface. In the fitting surface, a depression may be provided at a position facing the through hole of the terminal portion. The lid portion may have the thick portion. In the thick portion, thickness of a resin may be greater than that of a middle portion between adjacent corner portions across two sides forming the corner portion.

Four corner portions may be provided in the opening. The thick portion may be formed in each corner portion.

In the casing portion, a slit portion may be formed. The slit portion may extend outward from the corner portion. At least a part of an outline of the slit portion as viewed from an upper surface direction of the casing portion may be curved.

A connecting portion between the slit portion and a side of the opening may be curved as viewed from the upper surface direction.

A center line of the slit portion may be biased clockwise relative to a center line of the corresponding corner portion.

The terminal portion may have a pair of side surface portions. The pair of side surface portions may extend from a principal surface portion toward a bottom portion of the casing portion. The lid portion may have a protruding portion. The protruding portion may be provided so as to face a side surface portion of the terminal portion. The protruding portion may extend toward a bottom portion of the casing portion.

The protruding portion may be formed at a position biased toward the corner portion compared with a center line of the side surface portion.

In a corner portion on the side where the protruding portion is formed, in the casing portion, a slit portion may be formed. In a corner portion on the side where the protruding portion is not formed, in the casing portion, a slit portion may be formed. The slit portion may extend outward from the corner portion.

The terminal portion may have a pair of side surface portions. The pair of side surface portions may extend from the principal surface portion toward the bottom portion of the casing portion. In the thick portion, a portion facing an end surface of the terminal portion may be thicker than a portion facing a flat surface of the side surface portion.

The terminal portion may have a pair of side surface portions and a pair of foot portions. The pair of side surface portions may extend from the principal surface portion toward the bottom portion of the casing portion. The pair of foot portions may be coupled to respective side surface portions. The pair of foot portions may be connected to the bottom portion of the casing portion. A position of a line connecting two connection points where the pair of foot portions is fixed to the bottom portion as viewed from the upper surface direction of the casing portion may be shifted from a position of the through hole.

The summary clause does not necessarily describe all necessary features of the embodiments of the present invention. The present invention may also be a sub-combination of the features described above.

DESCRIPTION OF EXEMPLARY EMBODIMENTS

Hereinafter, the present invention is described through the embodiments of the invention. However, the following embodiments do not limit the invention according to the claims. Also, all the combinations of the features described in the embodiments) are not necessarily essential for means provided by aspects of the invention.

Figure 1:
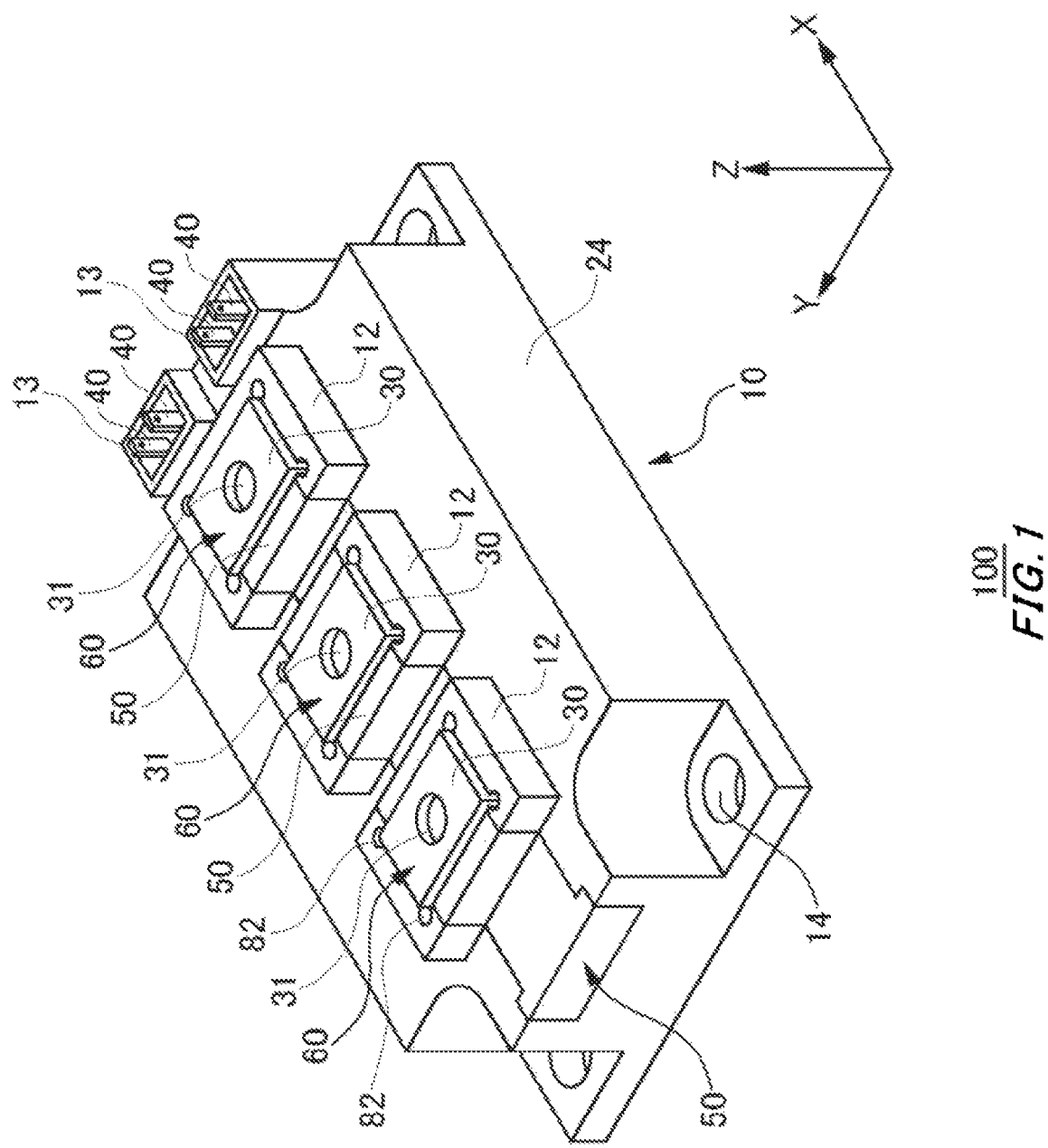
FIG. 1 is a perspective view schematically showing a semiconductor device 100 according to an embodiment of the present invention.

FIG. 1 is a perspective view schematically showing a semiconductor device 100 according to an embodiment of the present invention. The semiconductor device 100 houses therein an electronic circuit such as a semiconductor chip. The semiconductor device 100 in the present example includes a casing portion 10, a plurality of main terminals 60, and a plurality of control terminals 40. The main terminals 60 are an example of a terminal portion.

The casing portion 10 houses therein an electronic circuit such as a semiconductor chip. In an example, the casing portion 10 includes a bottom portion having a substrate on which the electronic circuit is mounted, a lid portion 24, and an insertion portion 50. The lid portion 24 is fixed to the bottom portion by adhesion or the like, and covers at least a part of the bottom portion. An electronic circuit such as a semiconductor chip is mounted on the part of the bottom portion covered by the lid portion 24. The lid portion 24 is formed of an insulating material such as a resin. Through holes 14 such as a screw hole for fixing the semiconductor device 100 to an external component are provided at a corner portion of the lid portion 24.

In this specification, a plane parallel to the front surface of the casing portion 10 is defined as an X-Y plane. Also, a longitudinal direction and a lateral direction of the front surface of the casing portion 10 are respectively defined as an X-direction and a Y-direction. Note that the lateral direction may be the X-direction and the longitudinal direction may be the Y-direction. Also, a direction perpendicular to the X-Y plane is defined as a Z-direction. In this specification, the Z-direction is referred to as a height direction in some cases. Also, a direction from the bottom portion of the casing portion 10 toward the front surface of the lid portion 24 is referred to as an upward direction and a direction from the front surface of the lid portion 24 toward the bottom portion is referred to as a downward direction, in some cases. Note that the upward and downward directions do not necessarily coincide with gravitational directions. Also, in XYZ coordinate axes shown in each figure, the side indicated with an arrow is the plus side, and the opposite side is the minus side.

The main terminal 60 is electrically connected to an electronic circuit covered by the lid portion 24. The main terminal 60 is formed of a conductive material. For example, each main terminal 60 forms a current path of a large current which flows in a power device such as an IGBT. At least a part of a principal surface portion 30 of the main terminal 60 is exposed at the front surface of the casing portion 10. The main terminal 60 in the present example has a plate shape.

The principal surface portion 30 of the main terminal 60 is exposed at the front surface of the lid portion 24 and has a plane approximately parallel to the front surface of the lid portion 24. A through hole 31 is formed in the principal surface portion 30 of the main terminal 60. When a screw or the like is inserted into the through hole 31, the semiconductor device 100 is thereby fixed to an external bus bar or the like. The main terminal 60 further has a pair of side surface portions which extends from the principal surface portion 30 toward the bottom portion of the casing portion 10. The side surface portion of the main terminal 60 is electrically connected to an electronic circuit provided to the bottom portion of the casing portion 10.

An opening for exposing a part of the main terminal 60 is provided to the lid portion 24. The opening in the present example is a groove extending in the X-direction on the front surface of the lid portion 24, and exposes the principal surface portion 30 of the main terminal 60. The opening is provided at the Y-direction center of the front surface of the lid portion 24. The casing portion 10 has thick portions in which the thickness of the casing portion 10 is increased at corner portions corresponding to the four corners of the principal surface portion 30 of the main terminal 60. Also, the casing portion 10 may have slit portions 82 extending outward from the corner portion. Details of the thick portion and the slit portion 82 will be described later.

The insertion portion 50 is inserted into the opening from a side surface direction of the casing portion 10, and provided so as to face the principal surface portion 30 of the main terminal 60. In the present example, the insertion portion 50 is arranged below the principal surface portion 30. The insertion portion 50 may have a fitting surface. In the fitting surface, a depression may be provided at a position facing a through hole 31 of the principal surface portion 30. When a nut or the like is provided in the depression, a screw or the like passing through the through hole 31 can be thereby fastened to the depression.

The lid portion 24 includes a main terminal arrangement portion 12 on its front surface. The main terminal arrangement portion 12 is provided protruding in the upward direction from the front surface of the lid portion 24. The principal surface portion 30 of the main terminal 60 is exposed at the front surface of the main terminal arrangement portion 12. Note that, the main terminal arrangement portion 12 is also provided with an opening for inserting thereinto the insertion portion 50.

The control terminal 40 has a linear shape with its width is smaller than that of the main terminal 60. One end of the control terminal 40 is exposed on the front surface of the lid portion 24. The other end of the control terminal 40 is electrically connected to an electronic circuit mounted on the bottom portion of the casing portion 10. The lid portion 24 includes a control terminal arrangement portion 13 surrounding portions of the control terminal 40 other than its edge.

Figure 2:
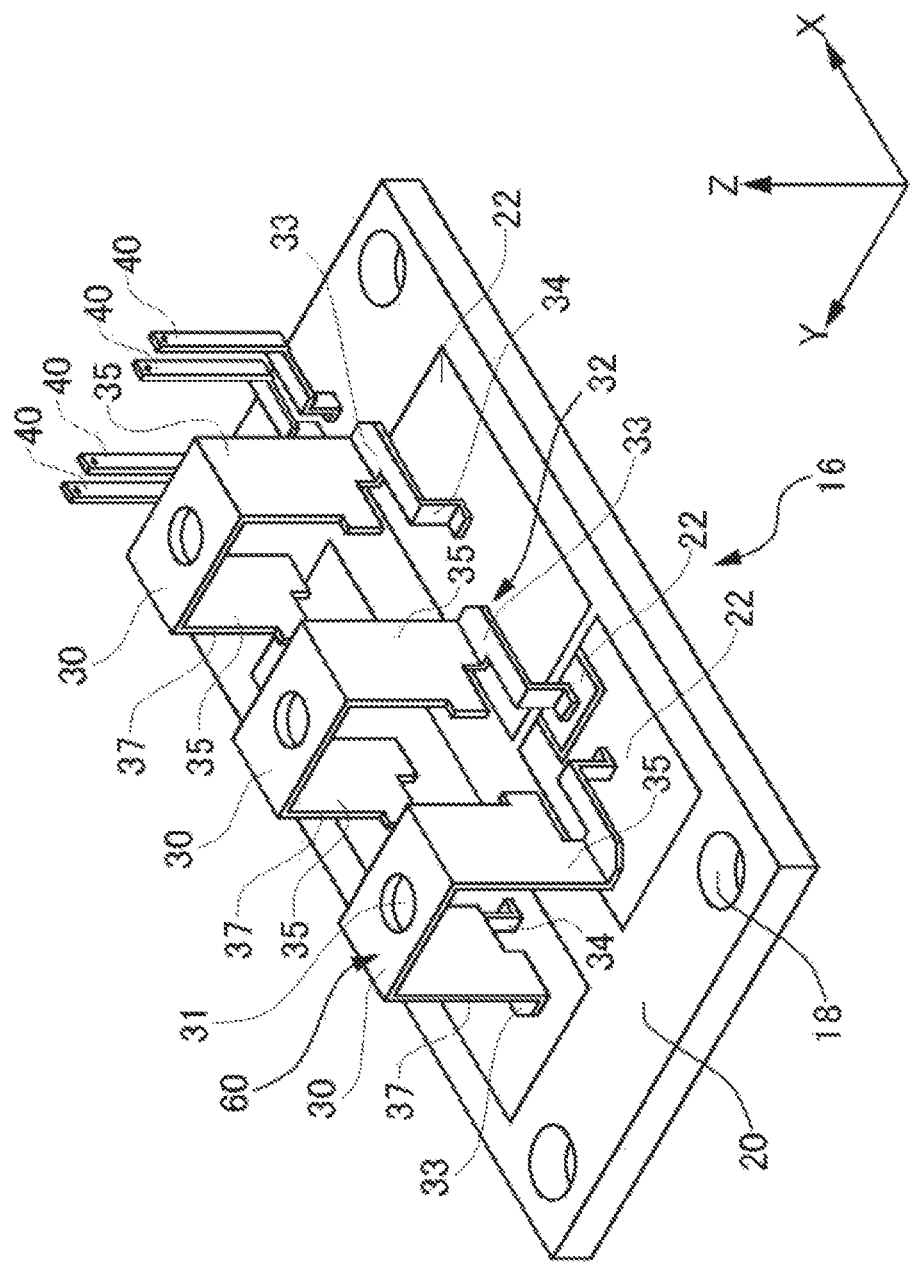
FIG. 2 is a perspective view schematically showing the bottom portion 16 of the casing portion 10 and the main terminals 60.

FIG. 2 is a perspective view schematically showing the bottom portion 16 of the casing portion 10 and the main terminals 60. The bottom portion 16 includes a substrate 20 and an electronic circuit 22. The substrate 20 includes a metal plate such as a copper plate and an insulating layer covering the front surface of the metal plate. It may further include a metal layer on the insulating layer on a side of the metal plate. The electronic circuit 22 is provided on the insulating layer. The electronic circuit 22 may have a pad connecting with the main terminal 60 and the control terminal 40.

The semiconductor device 100 may include a plurality of main terminals 60. In the example in FIG. 2, three main terminals 60 are aligned along a direction in which the insertion portion 50 is inserted (the X-direction in the present example). Each main terminal 60 includes a principal surface portion 30, a side surface portion 35 and a foot portion 32. The principal surface portion 30 is arranged in parallel with the X-Y plane.

The side surface portions 35 are provided extending from both Y-direction ends of the principal surface portion 30 toward the bottom portion 16. Each side surface portion 35 is arranged in parallel with the X-Z plane. Both X-direction ends of the principal surface portion 30 and both X-direction ends of the side surface portion 35 form an end surface 37 of the main terminal 60. The foot portion 32 is coupled to an end side of the side surface portion 35 closer to the bottom portion 16, and is connected to the bottom portion 16. A position of a line connecting two connection points where the pair of foot portions 32 is fixed to the bottom portion 16 is shifted from a position of the through hole 31 as viewed from the upper surface direction of the casing portion 10 (the Z-direction).

Therefore, in the main terminal 60 of the present example, every time the fastening torque is applied to the main terminal 60 when fastening the screws or the like having passed through the through hole 31 to the depression, the main terminal 60 easily changes its position. Therefore, it is desirable to increase the intensity of the casing portion 10 around the corner portion, such that the casing portion 10 is not damaged even when the corner portion of the main terminal 60 hits or rubs against the region including the corner portion of the opening of the lid portion 24.

Note that, the foot portion 32 is flexible such that the main terminal 60 can be inclined in accordance with applied force. For example, the foot portion 32 supports the main terminal 60 such that it can be inclined in the X-Z plane. The foot portion 32 may also support the main terminal 60 such that it can further be inclined in the Y-Z plane.

The foot portion 32 in the present example includes an extending portion 33 and a fixing portion 34. The extending portion 33 is coupled to a part of an end side of the side surface portion 35 closer to the bottom portion 16, and is provided extending along the X-direction. In an example, the extending portion 33 is provided at an outer side of each side surface portion 35, and extends from one X-direction end of an end side of the side surface portion 35 closer to the bottom portion 16 toward the other X-direction end of the end side. The extending portion 33 has a shape of a plate parallel to the X-Y plane.

The fixing portion 34 is provided at, from among ends of the extending portion 33, an end at the opposite side to an end connected to the side surface portion 35. The fixing portion 34 is provided extending from the end of the extending portion 33 toward the bottom portion 16. The lower end of the fixing portion 34 is fixed to the electronic circuit 22 with a solder or the like.

Figure 3:
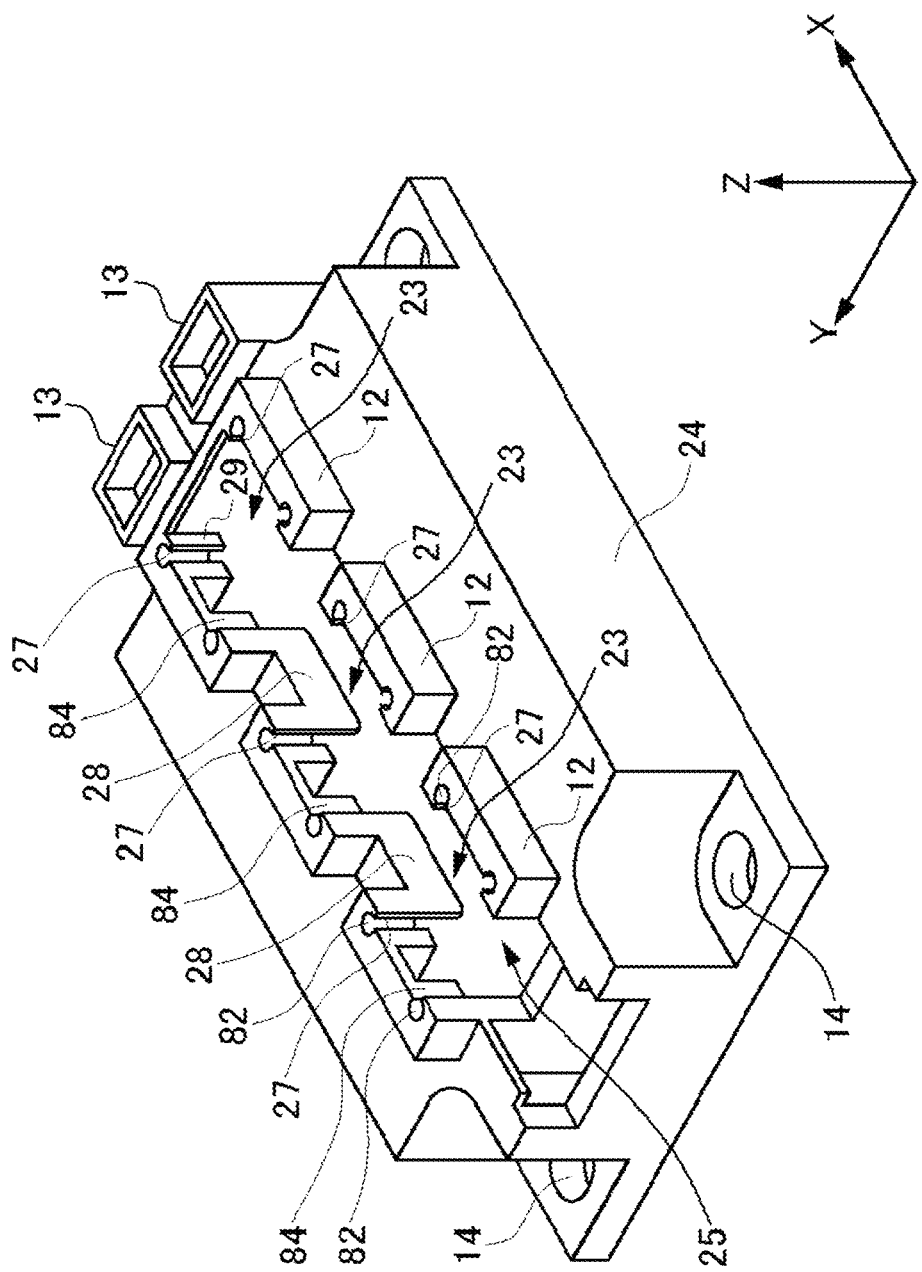
FIG. 3 is a perspective view schematically showing the lid portion 24.

FIG. 3 is a perspective view schematically showing the lid portion 24. The lid portion 24 includes an opening 25 at its front surface. The opening 25 is formed extending from one X-direction end of the front surface of the lid portion 24 toward the other end. The opening 25 includes an opening for terminal 23 for exposing the principal surface portion 30 of the main terminal 60. On the front surface of the lid portion 24, a main terminal arrangement portion 12 is provided on both Y-direction sides of the opening 25. The main terminal arrangement portion 12 is provided at a position corresponding to each main terminal 60. The main terminal 60 is exposed at the opening for terminal 23 provided in the corresponding main terminal arrangement portion 12.

The lid portion 24 is assembled together with the bottom portion 16 such that the lid portion 24 is put on the bottom portion 16 from above in the Z-direction. At this time, each main terminal 60 is inserted into the opening for terminal 23 of the main terminal arrangement portion 12 along an inner wall of the opening for terminal 23. Therefore, the main terminal 60 may be positioned using the inner wall of the opening for terminal 23 of the main terminal arrangement portion 12 as a reference plane. Also, the control terminal 40 is inserted into the opening of the control terminal arrangement portion 13 along the side wall of the opening.

Each main terminal arrangement portion 12 includes a ceiling portion which is parallel to the X-Y plane. Also, a joint portion 28 is provided between main terminal arrangement portions 12 adjacent in the X-direction. The thickness of the joint portion 28 in the Z-direction is greater than that of the ceiling portion of the main terminal arrangement portion 12. The joint portion 28 has an end surface facing portion 27 exposed to the opening 25. The end surface facing portion 27 has a surface facing the end surface 37 of the main terminal 60. In the present example, the end surface facing portion 27 and the end surface 37 of the main terminal 60 are parallel to the Y-Z plane. The end surface facing portion 27 has longer sides in the Z-direction.

Note that, a terminal end 29 is provided instead of the joint portion 28 in the main terminal arrangement portion 12 arranged on the far-most side in the X-direction. The terminal end 29 has an end surface facing portion 27 exposed in the opening 25 similar to the joint portion 28.

In the present example, the opening for terminal 23 of the lid portion 24 has four corner portions per one main terminal 60. The corner portions correspond to the four corner portions of the principal surface portion 30. The corner portion is configured by a side in the X-direction and a side in the Y-direction of the opening for terminal 23. The lid portion 24 of the casing portion 10 has a thick portion 84 in a surrounding area of the opening 25.

The thick portion 84 is a portion in which thickness of a resin is greater than that of a middle portion between adjacent corner portions across two sides forming the corner portion. Here, the thickness means the thickness in the direction from the upper surface toward the bottom portion of the casing portion 10. In the present example, it means the thickness in the Z-direction. Also, as shown in FIG. 3, the slit portion 82 extending outward from the corner portion at the corner portion may penetrate from the upper surface toward the bottom portion of the lid portion 24.

Figure 4:
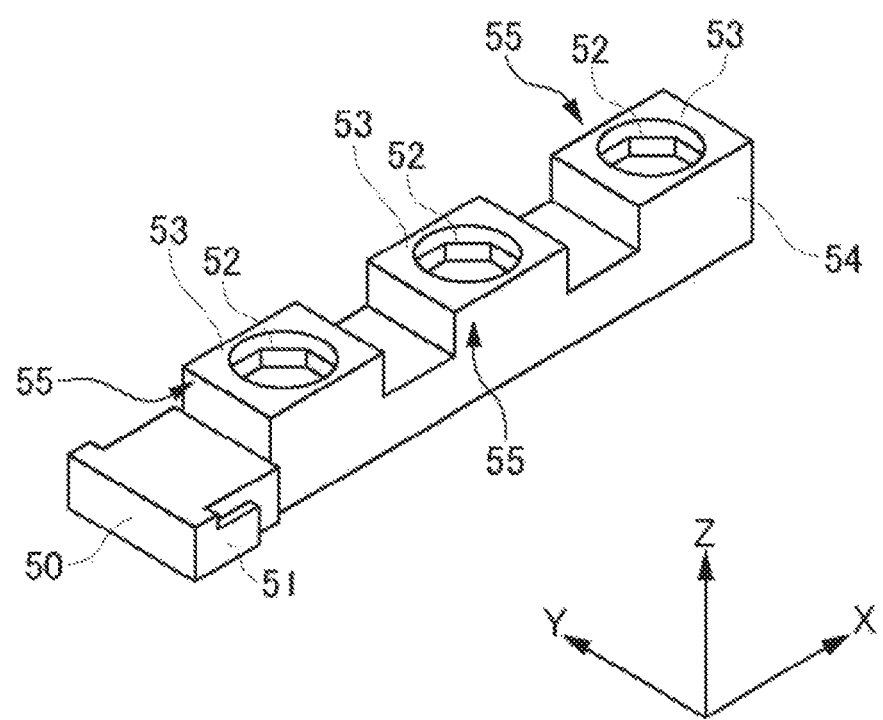
FIG. 4 is a perspective view schematically showing the insertion portion 50.

FIG. 4 is a perspective view schematically showing the insertion portion 50. The insertion portion 50 has the same width in the Y-direction and the same length in the X-direction as the opening 25 provided to the front surface of the lid portion 24. The insertion portion 50 is inserted into the opening 25 along the X-direction. The insertion portion 50 is inserted between the principal surface portion 30 of the main terminal 60 and the bottom portion 16.

The insertion portion 50 includes a principal surface facing portion 55 facing the principal surface portion 30 of each main terminal 60. Each principal surface facing portion 55 protrudes in the Z-direction from the front surface of the insertion portion 50. A depression 52 is provided to a front surface 53 of each principal surface facing portion 55.

The depression 52 is provided at a position facing the through hole 31 of the main terminal 60. In an example, the depression 52 is provided at the center of the front surface 53 of the principal surface facing portion 55. The depression 52 may have a greater diameter than that of the through hole 31. A nut or the like is arranged inside the depression 52. A screw or the like passing through the through hole 31 is fastened to the nut or the like inside the depression 52. When a screw and the like are fastened, the principal surface portion 30 of the main terminal 60 is thereby pressed against the principal surface facing portion 55. Therefore, the insertion portion 50 functions as a nut glove.

The insertion portion 50 may also include a locking portion 51 which is fitted with the lid portion 24 to fix the insertion portion 50 to the lid portion 24. In an example, the locking portion 51 may be provided at one end of the insertion portion 50 that is inserted into the opening 25 posterior to the other end. The locking portion 51 in the present example protrudes in the Y-direction. The locking portion 51 is fitted with a depression provided to the lid portion 24. The insertion portion 50 may also be fixed to the lid portion 24 with an adhesive or the like when inserted into the opening 25.

Figure 5:
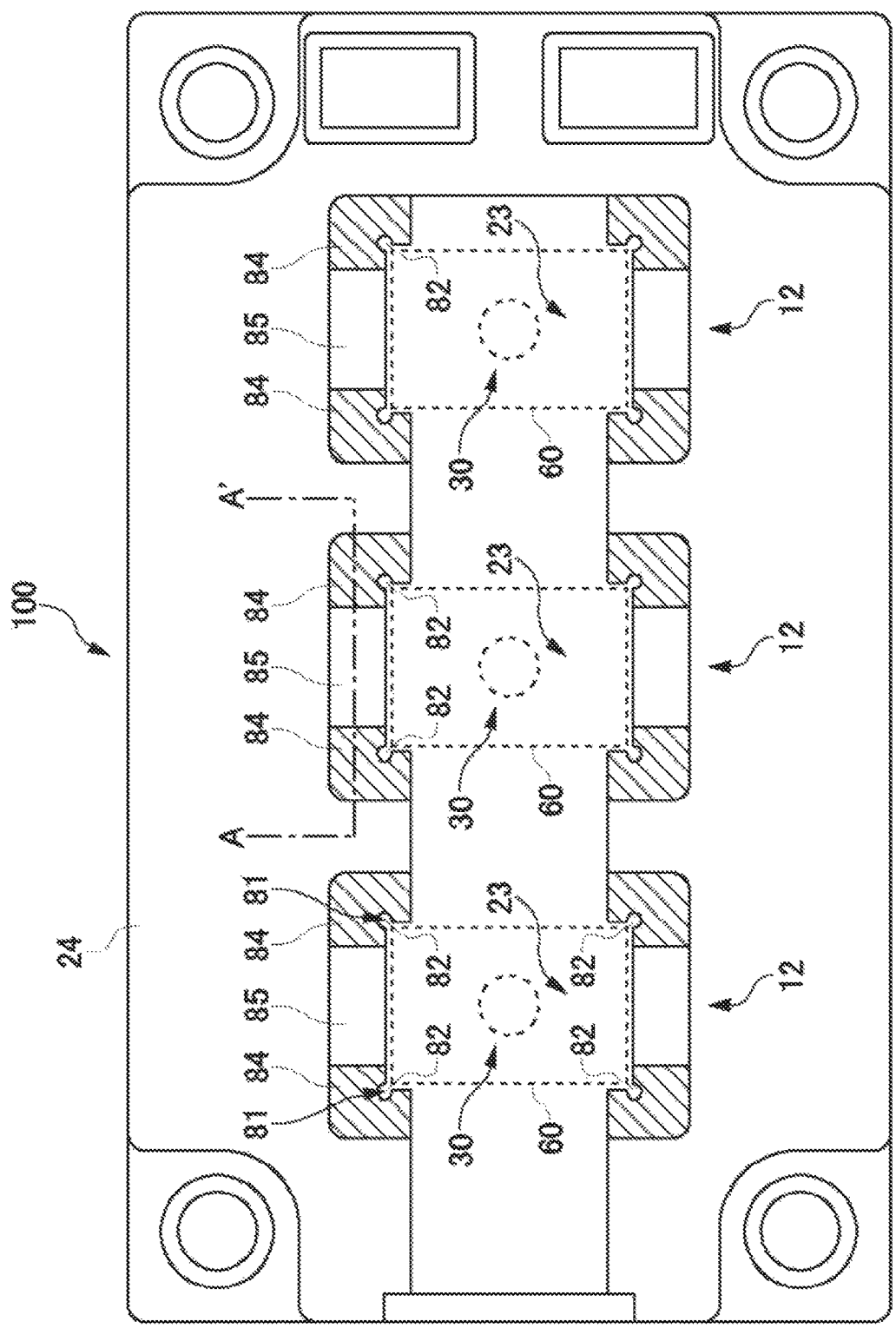
FIG. 5 is a top view of a semiconductor device 100.
Figure 6:
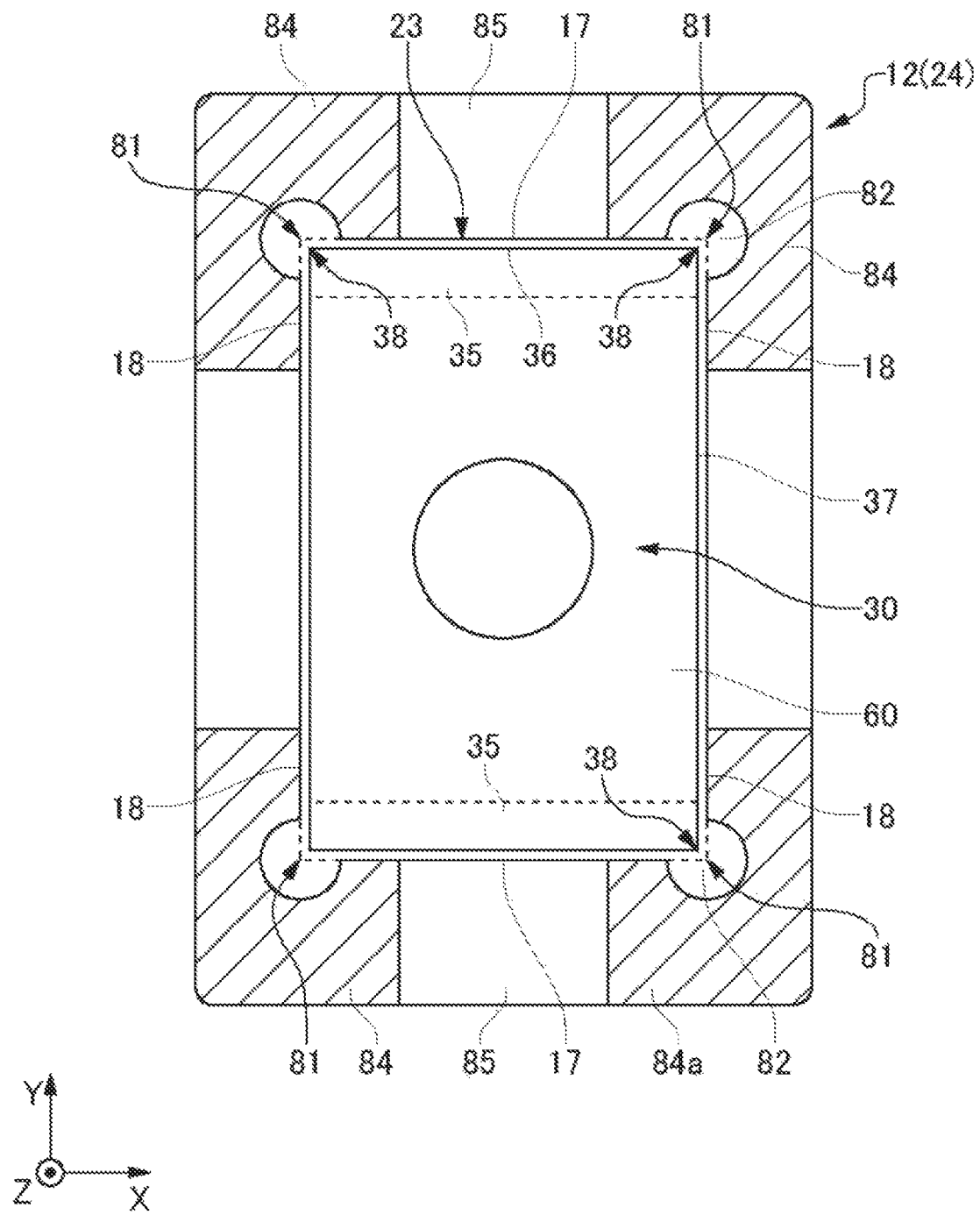
FIG. 6 is a required part enlarged view of an upper surface of a semiconductor device 100.

FIG. 5 is a top view of a semiconductor device 100. FIG. 6 is a required part enlarged view of an upper surface of a semiconductor device 100. FIG. 6 is an enlarged view showing a region of one main terminal arrangement portion 12 of the semiconductor device 100. In FIG. 5 and FIG. 6, hatching is applied to the portions of the thick portions 84. The lid portion 24 has a thick portion 84. In the thick portion 84, the thickness of the resin is greater than that of the middle portion 85 between the adjacent corner portions 81. As shown in FIG. 6, the thick portion 84 is formed across two sides of the opening for terminal 23; the first side 17 and the second side 18.

The lengths of a thick portion 84 along the first side 17 and the second side 18 from one of a corner portion 81 where it is formed may be ¹⁄₁₀ and ⅓ inclusive of the entire lengths of the first side 17 and the second side 18, respectively. The first side 17 and the second side 18 may extend in different direction from each other. In the present example, the first side 17 extends in the X-direction, and the second side 18 extends in the Y-direction. In the present example, the principal surface portion 30 of the main terminal 60 is a rectangle, and the first side 17 and the second side 18 correspond to the sides of the rectangle of the principal surface portion.

In the present example, three main terminals 60 per one semiconductor device 100 are aligned along a direction in which the insertion portion 50 is inserted (the X-direction in the present example). Each opening for terminal 23 has four corner portions 81 per one principal surface portion 30. The corner portion 81 may be an intersection point if the first side 17 and the second side 18 of the opening for terminal 23 are virtually extended. A thick portion 84 is formed in each corner portion 81.

Figure 7:
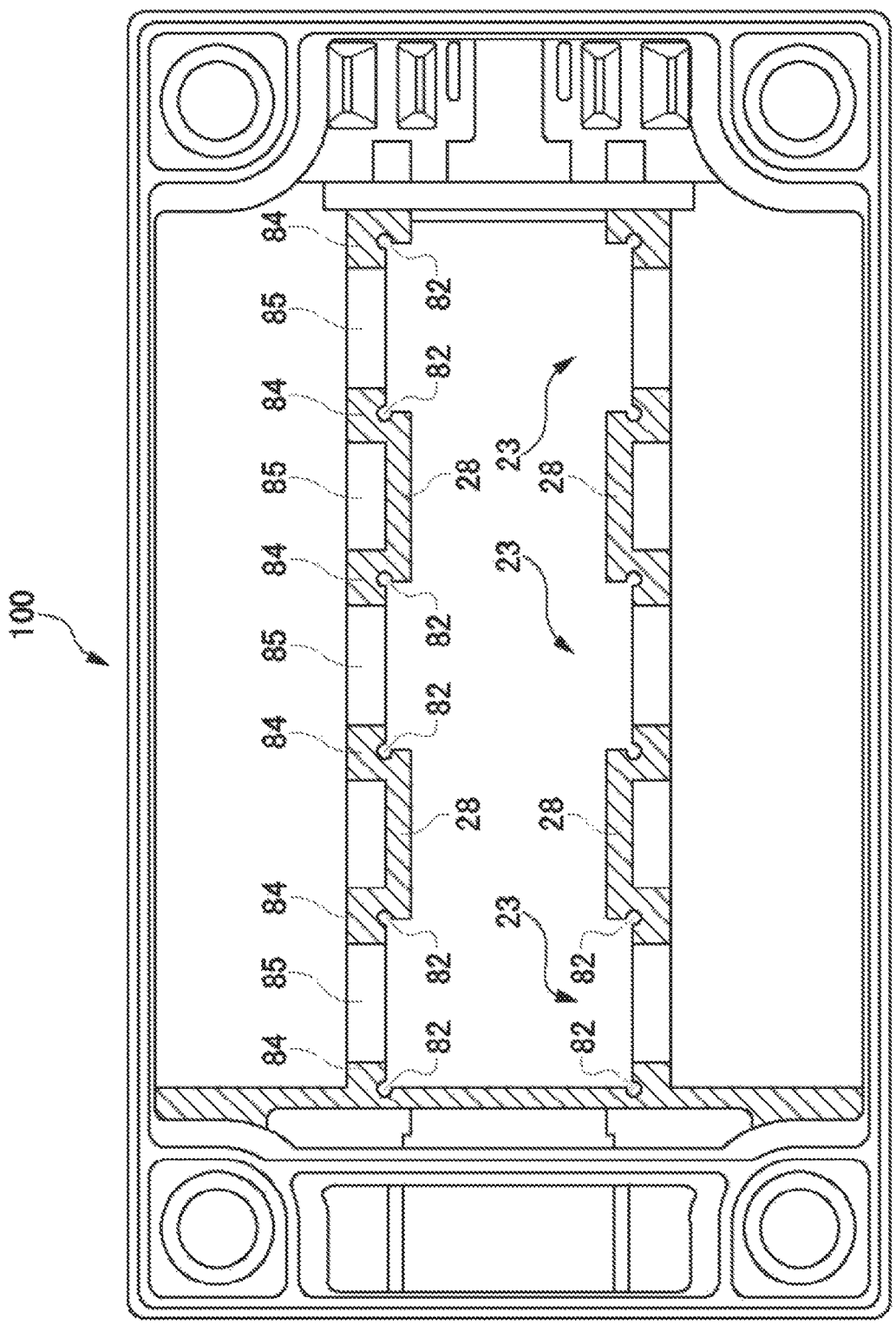
FIG. 7 is a bottom view of a semiconductor device 100.

FIG. 7 is a bottom view of a semiconductor device 100. The thickness of the joint portion 28 between the main terminal arrangement portions 12 in the Z-direction is greater than that of the middle portion 85. Therefore, the joint portion 28 may be integrally coupled to the thick portions 84 at both ends in the X-direction, respectively. In this case, the two thick portions 84 and the joint portion 28 are coupled to each other to form a region the thickness of which in the Z-direction is greater than that of the middle portion 85.

Figure 8:
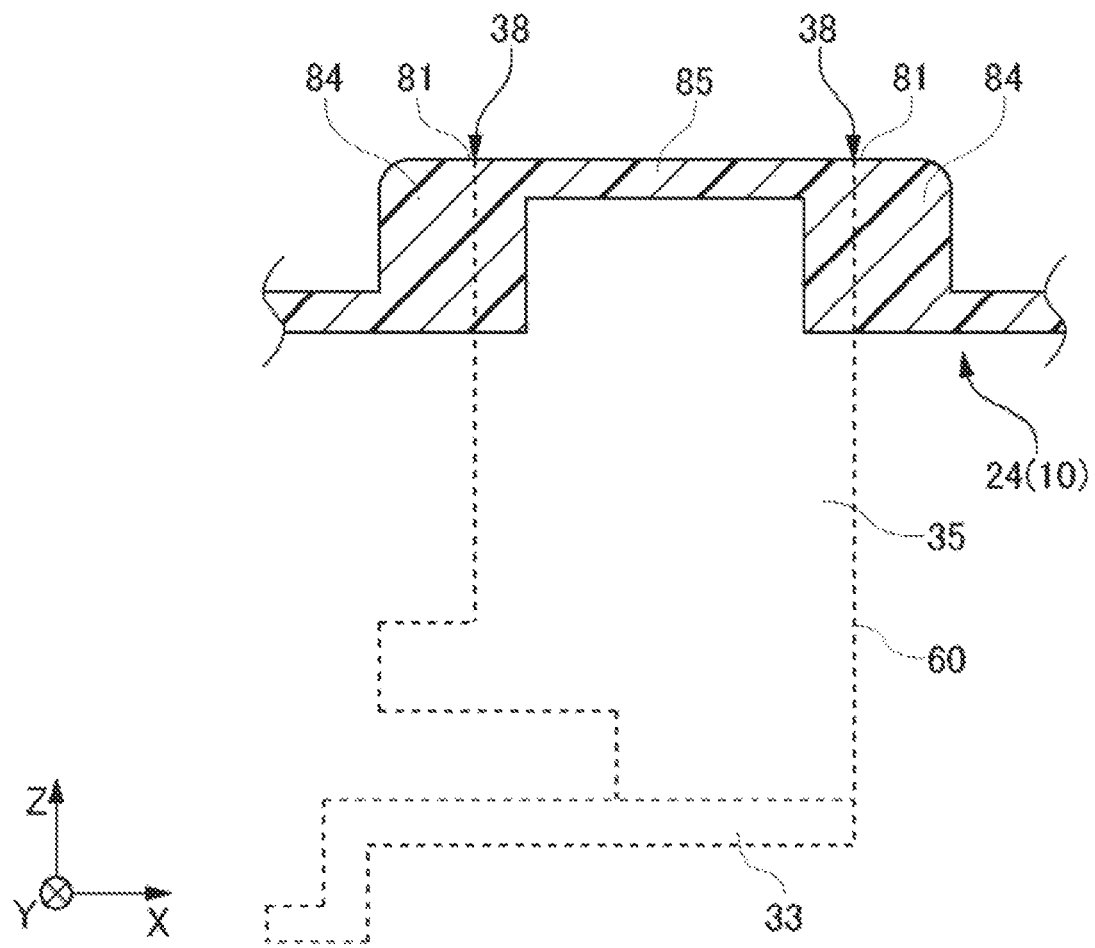
FIG. 8 is a cross-sectional view of a semiconductor device 100.

FIG. 8 is a cross-sectional view of a semiconductor device 100. FIG. 8 shows a cross-sectional view taken along the line A-A' in FIG. 5. In FIG. 8, an arrangement example of a main terminal 60 is indicated with dotted lines. A clearance exists between the main terminal 60 and the opening for terminal 23 of the casing portion 10 in consideration of the component tolerance and the assembly of the casing portion 10. Also, in the main terminal 60 fixed to the bottom portion 16 via the foot portion 32, terminal deformation due to mechanical external force is easily generated. Therefore, because every time the fastening torque is applied to the main terminal 60, the main terminal 60 is inclined or changes its position within the casing portion 10, the corner 38 of the principal surface portion 30 of the main terminal 60 is pressed against the lid portion 24. This applies a burden to the casing portion 10.

However, according to the present example, the casing portion 10 has the thick portion 84, in which thickness of a resin of the thick portion in the Z-direction is greater than that of the middle portion 85 between adjacent corner portions 81, in a surrounding area of the opening 25. The thick portion 84 functions as a beam which increases the intensity of the casing portion 10. Therefore, according to the present example, because the casing portion 10 has the thick portion 84 at the corner portion 81 where a large force tends to be applied to the casing portion 10, it is possible to prevent breakage of the casing portion 10 beforehand. Because the casing portion 10 can define the position and direction of the main terminal 60 without breaking the casing portion 10, the dimensional position accuracy of the main terminal 60 can be maintained high.

Figure 9:
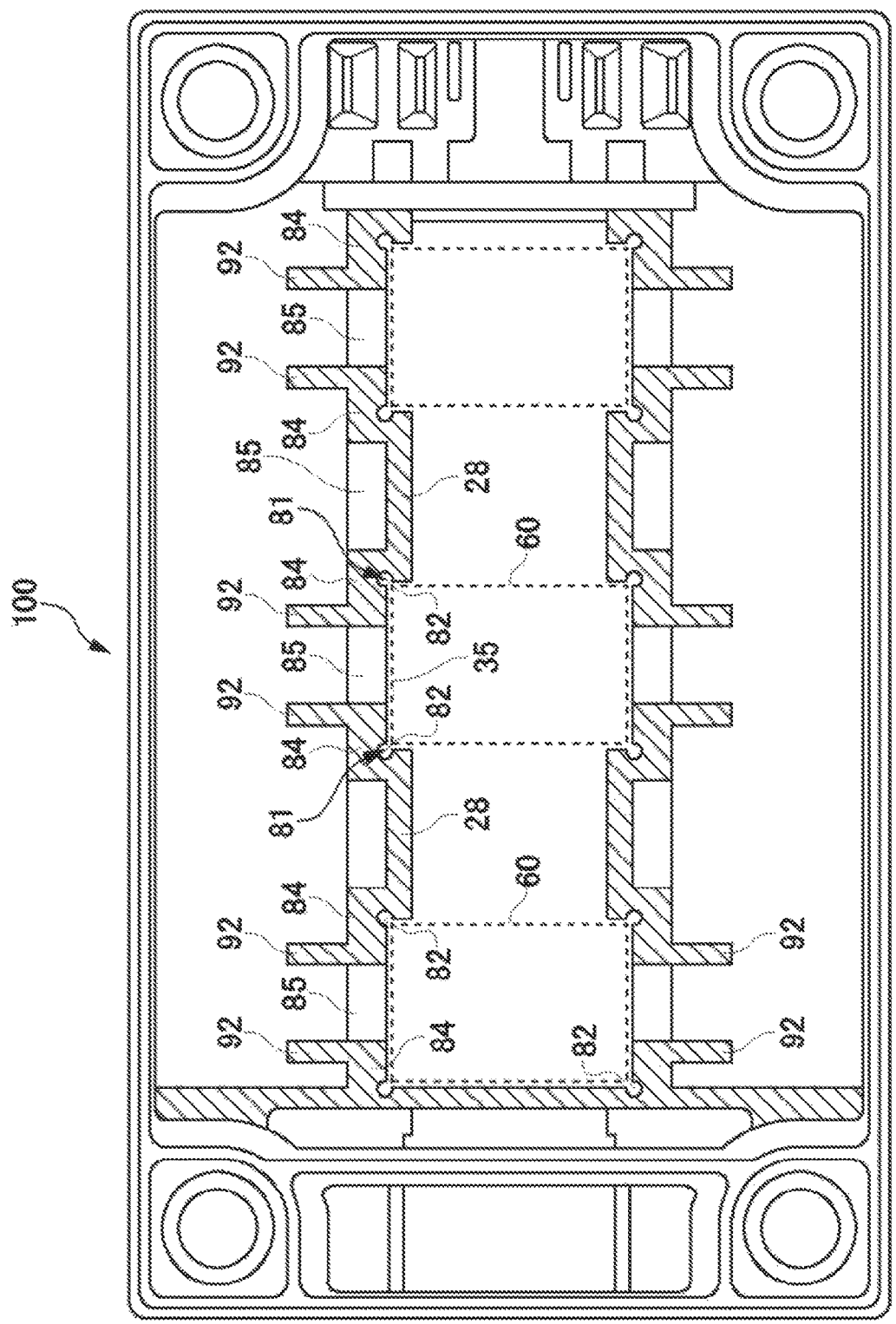
FIG. 9 is a bottom view of a modification example of a semiconductor device 100 including a protruding portion 92.

FIG. 9 is a bottom view of a modification example of a semiconductor device 100 including a protruding portion 92. In FIG. 9, an arrangement example of a main terminal 60 is indicated with dotted lines for reference. The protruding portion 92 is arranged to follow the side surface portion 35 of the main terminal 60 when the main terminal 60 is inserted into the opening of the main terminal arrangement portion 12. The lid portion 24 has a protruding portion 92 which is provided so as to face the side surface portion 35 of the main terminal 60 and extends toward the bottom portion 16 of the casing portion 10. In the present example, the protruding portion 92 is formed at a position biased toward the corner portion 81 from the center line of the side surface portion 35 in the X-direction. Note that, the protruding portion 92 may be formed at a position not biased from the center line of the side surface portion 35 in the X-direction.

In the present example, the thick portion 84 and the protruding portion 92 are coupled to each other, and configure a region the thickness of a resin of which is greater than that of the middle portion 85. Note that, not being limited to this case, a region the thickness of a resin of which is smaller than those of the thick portion 84 and the protruding portion 92 may be formed between the thick portion 84 and the protruding portion 92.

In the present example, the protruding portions 92 are provided in direct contact with all the corner portions 81. Note that, the present invention is not limited to this case. The protruding portion 92 may be provided on one of the two corner portions 81 corresponding to one main terminal 60 and adjacent to each other along the X-direction. In the corner portion 81 on the protruding portion 92 is formed, a slit portion 82 extending outward from the corner portion 81 may be formed in the casing portion 10.

Because the thickness of a resin of the protruding portion 92 in the Z-direction is greater than that of the middle portion 85, providing the protruding portion 92 contributes to increasing the intensity of the corner portion 81. The slit portion 82 prevents a force from being locally applied to the corner portion 81. Therefore, in the corner portion 81 on the side where the protruding portion 92 is formed, the effect of the thick portion 84, the protruding portion 92, and the slit portion 82 can intensively increase the breakage-prevention effect in the specific corner portion 81.

On the other hand, in the corner portion 81 on the side where the protruding portion 92 is not formed, a slit portion 82 extending outward from the corner portion may be formed in the casing portion 10. In the corner portion 81 on the side where the protruding portion 92 is formed, the effect of the thick portion 84 and the protruding portion 92 increases the intensity of the corner portion 81. On the other hand, in the corner portion 81 on the side where the protruding portion 92 is not formed, forming the slit portion 82 to prevent a force from being locally applied to the corner portion 81 can prevent damage to the casing portion 10 and the like.

Figure 10:
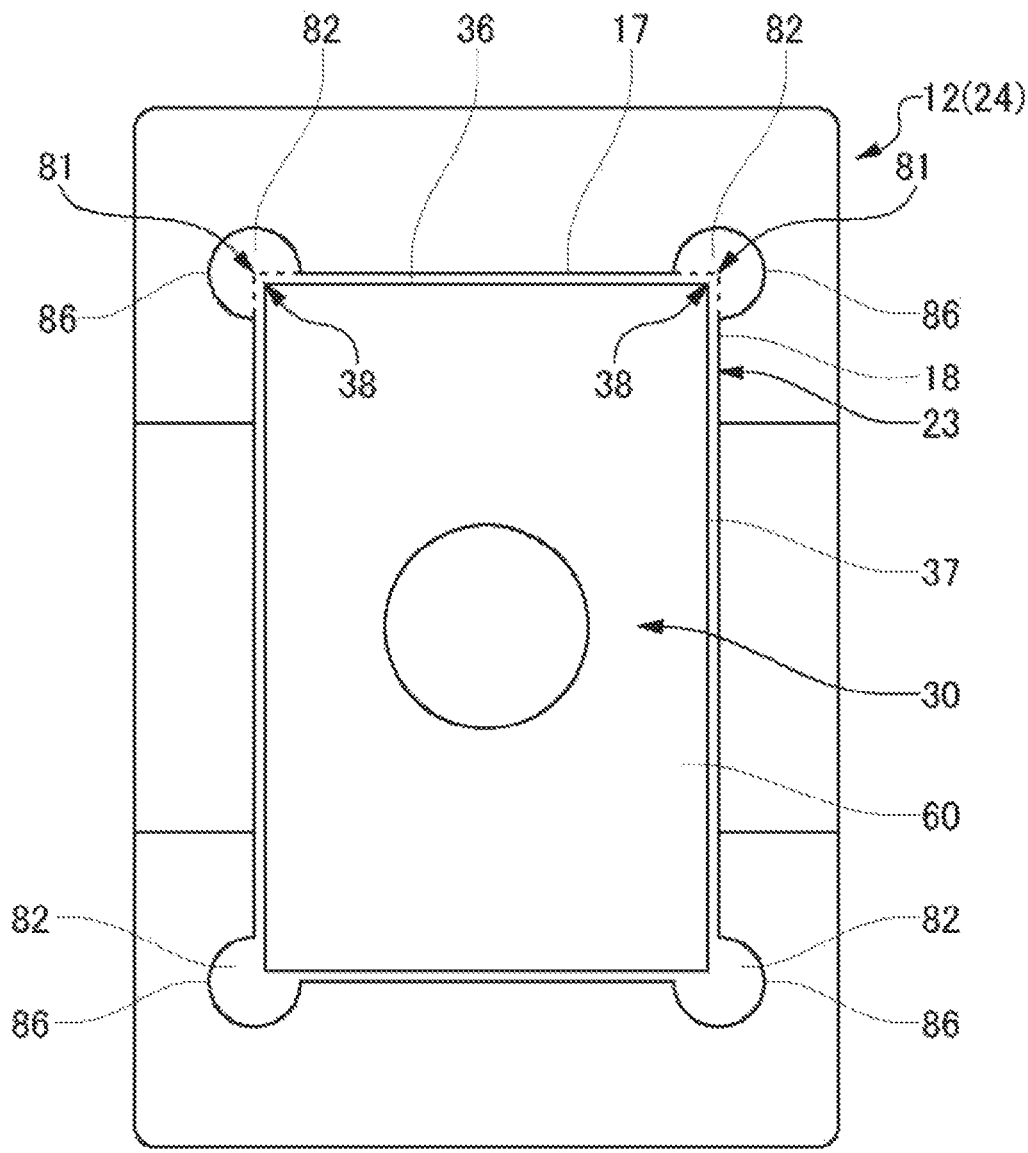
FIG. 10 is a required part enlarged view of a semiconductor device 100.
Figure 10:
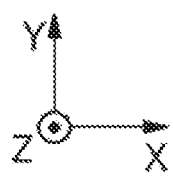

FIG. 10 is a required part enlarged view of a semiconductor device 100. In particular, FIG. 10 shows the main terminal arrangement portion 12 in the lid portion 24 of the casing portion 10. The opening for terminal 23 provided to the lid portion 24 exposes the principal surface portion 30 of the main terminal 60. The opening for terminal 23 has a corner portion 81 corresponding to the corner 38 of the principal surface portion 30. In the lid portion 24 of the casing portion 10, a slit portion 82 extending outward from the corner portion 81 is formed. The slit portion 82 may be a concave portion processed into an R shape. At least a part of the outline of the slit portion 82 as viewed from the upper surface direction of the casing portion 10 is formed by a curve 86. In the present example, the curve 86 may be a circle or an arc. The curvature radius R of the slit portion 82 may be 0.5 mm or more and 2 mm or less.

Because the slit portion 82 extends outward from the corner portion 81, the corner 38 of the main terminal 60 can be positioned in the internal space of the slit portion 82. Therefore, compared with the case where the inner wall of the opening for terminal 23 is simply chamfered to round, interference of the corner 38 of the main terminal 60 with the inner wall of the opening for terminal 23 hardly occurs.

The stress tends to concentrate at a location where the outline of the opening for terminal 23 changes at an acute angle. According to the present example, because at least a part of the outline of the slit portion 82 as viewed from the upper surface direction of the casing portion 10 is formed by the curve 86, it is possible to reduce locations where the outline of the opening for terminal 23 changes at an acute angle. Therefore, because the stress can be dispersed even when a force is applied to the lid portion 24 by the movement of the main terminal 60 due to the fastening torque, breakage of the lid portion 24 does not occur.

Figure 11:
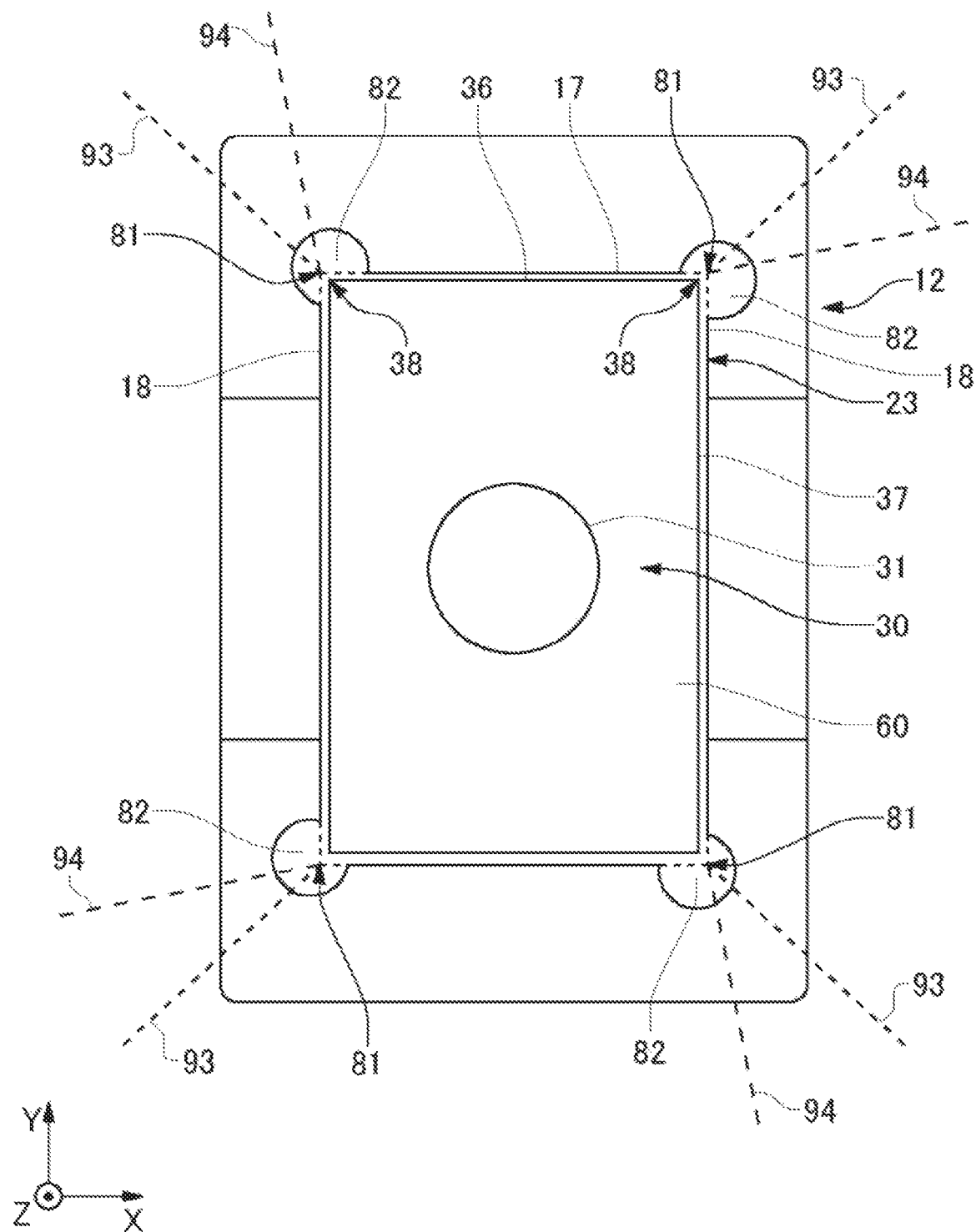
FIG. 11 shows a modification example of a semiconductor device 100 in which a slit portion 82 is eccentric.

FIG. 11 shows a modification example of a semiconductor device 100 in which a slit portion 82 is eccentric. In FIG. 11, in the lid portion 24, a slit portion 82 extending outward from the corner portion 81 is formed. The slit portion center line 94, which is the center line of the slit portion 82, is biased clockwise relative to the center line 93 of the corresponding corner portion 81. The center line 93 of the corner portion 81 is a bisector of the corner of the corner portion 81. The slit portion center line 94 is a line passing through the corner portion 81, and is a line bisecting the area of the slit portion 82 as viewed from the upper surface direction (Z+-direction) of the casing portion 10. The clockwise side means the direction in which the hands of the clock go forward as viewed from the Z+-direction. The structure shown in FIG. 11 is similar to that in FIG. 10, except that the center line of the slit portion 82 is eccentric relative to the center line 93 of the corner portion 81. Therefore, a repetitive description will be omitted.

When inserting a bolt or the like into the through hole 31 of the main terminal 60 and fastening the bolt, the main terminal 60 tends to rotate clockwise as well along with the operation of rotating the bolt clockwise and tightening the bolt. Because the center line of the slit portion 82 is biased toward the clockwise side relative to the center line 93 of the corresponding corner portion 81, the slit portion 82 functions as a clearance groove of the corner portion 81 of the main terminal 60 that has rotated clockwise. Therefore, it is possible to prevent the main terminal 60 from strongly pressing the lid portion 24 in advance.

Figure 12:
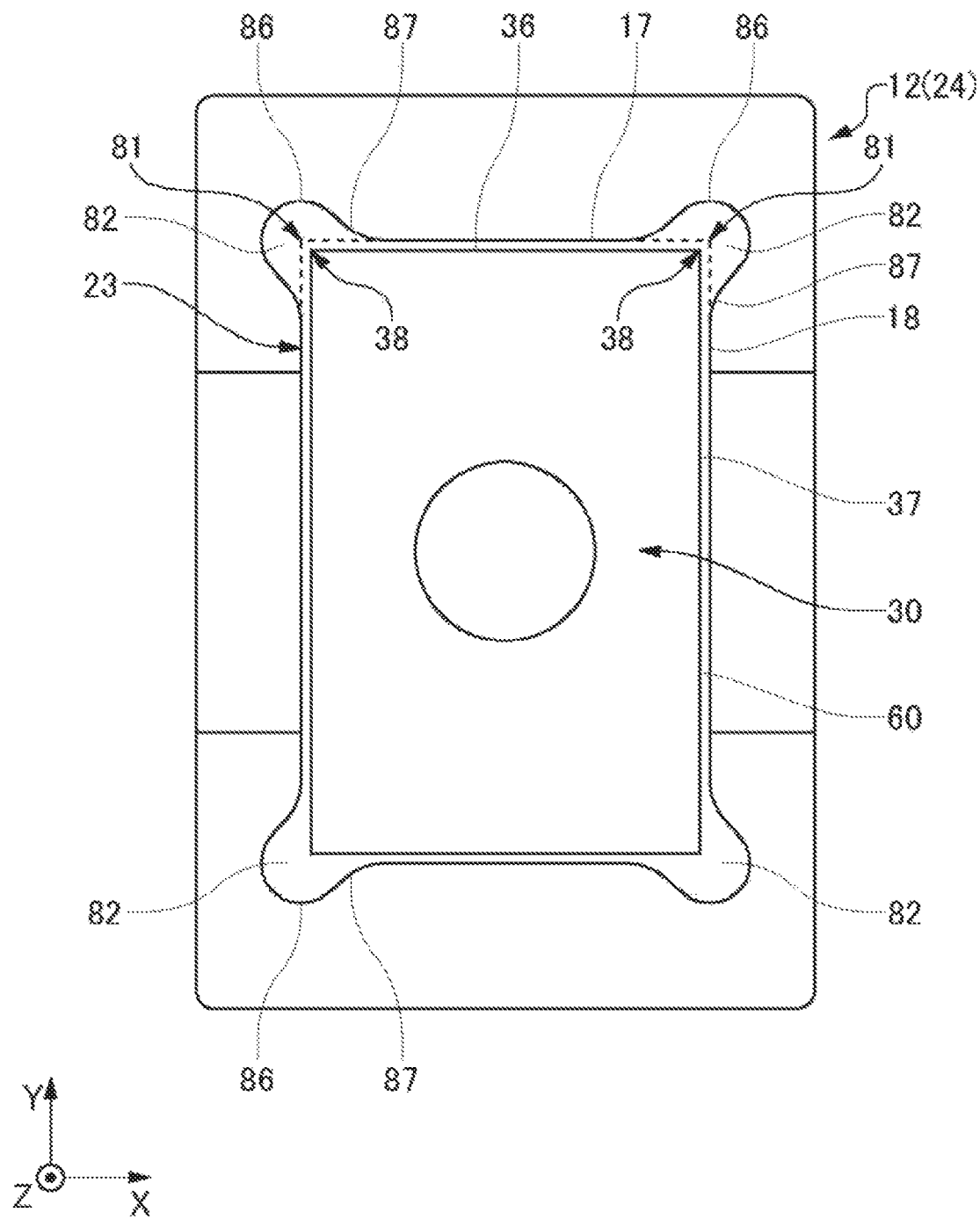
FIG. 12 shows a modification example of a semiconductor device 100 in which the connection portion 87 connecting the slit portion 82 and the sides is curved.

FIG. 12 shows a modification example of a semiconductor device 100 in which the connection portion 87 connecting the slit portion 82 and the sides is curved. In the examples shown in FIG. 10 and FIG. 11, the slit portion 82 and the sides of the opening for terminal 23 are not necessarily smoothly connected. In the present example, the connection portion 87 connecting the slit portion 82 and the sides is curved as viewed from the upper surface direction of the casing portion 10.

In the present example, the slit portion 82 may be formed by a curve 86, which is a circle or an arc. The curve of the connection portion 87 connects between the curve 86 and the side, which is a straight line. In particular, the curve 86 and the curve of the connection portion 87 may form a smooth curve. The structure shown in FIG. 12 is similar to those in FIG. 10 and FIG. 11 except the connection portion 87. Therefore, a repetitive description will be omitted.

According to the present example, because the connection portion 87 is curved as viewed from the upper surface direction of the casing portion 10, it is possible to reduce locations where the outline of the opening for terminal 23 changes at an acute angle as viewed from the upper surface direction of the casing portion 10. Furthermore, because the curve 86 and the curve of the connection portion 87 form a smooth curve and no sharp point is generated, it is possible to prevent stress from being locally generated.

Figure 13:
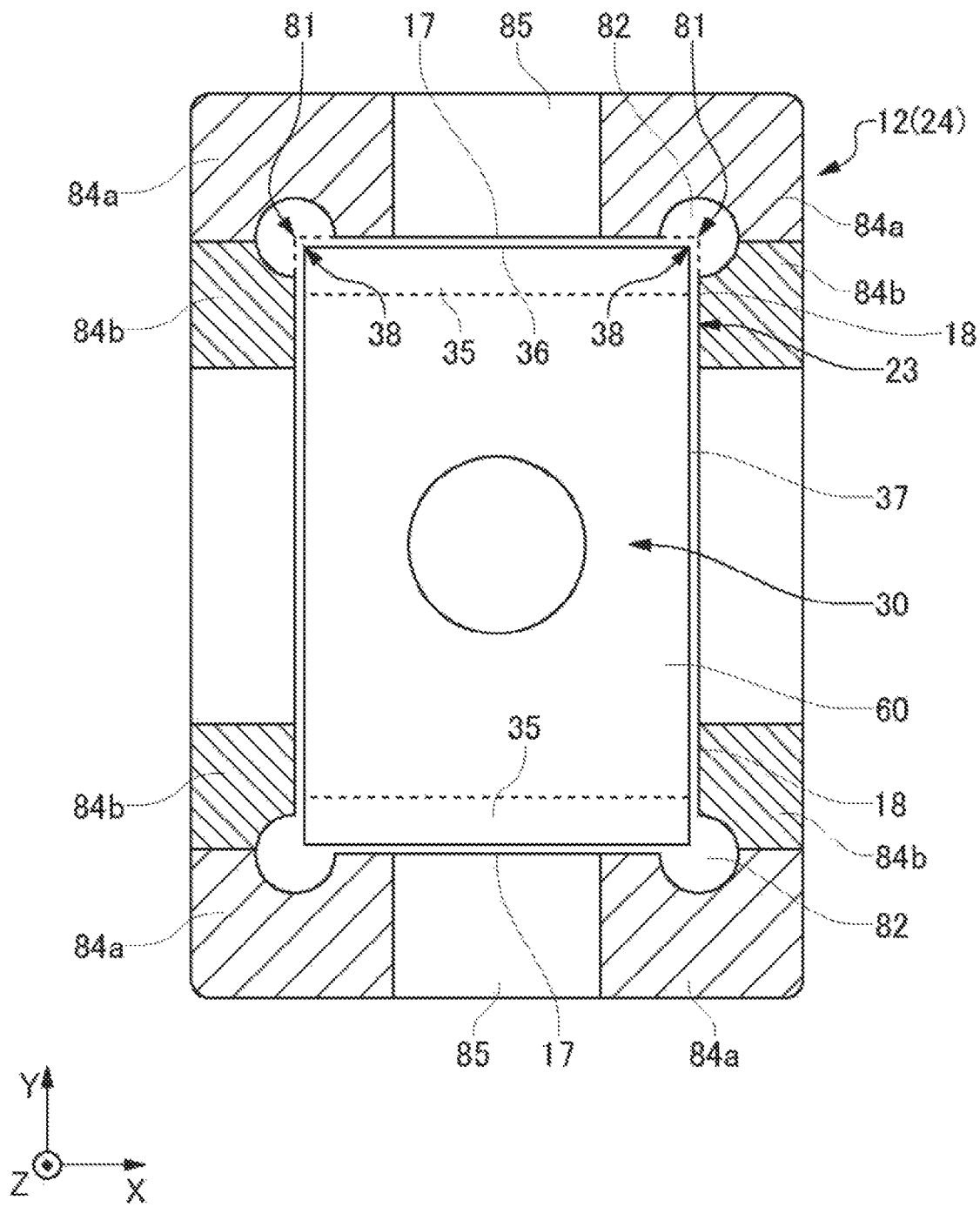
FIG. 13 shows a modification example of a semiconductor device 100 in which the thickness of the thick portion 84 is changed in accordance with the positional relationship with the main terminal 60.

FIG. 13 shows a modification example of a semiconductor device 100 in which the thickness of the thick portion 84 is changed in accordance with the positional relationship with the main terminal 60. The main terminal 60 has a pair of side surface portions 35 which extends from the principal surface portion 30. The thick portion 84 formed in the corner portion 81 is generally categorized into a thick portion 84a and a thick portion 84b, in accordance with the positional relationship with the main terminal 60. The thick portion 84a faces a flat surface 36 of the side surface portion 35 of the main terminal 60. On the other hand, the thick portion 84b faces an end surface 37 of the main terminal 60. In the present example, the end surface 37 of the main terminal 60 refers to a plate-shaped plane along the thickness direction of the terminal.

In the present example, the thick portion 84b is thicker than the thick portion 84a. The area of the end surface 37 of the main terminal 60 is smaller than the area of the flat surface 36 of the side surface portion 35 of the main terminal 60. Therefore, even when the main terminal 60 having received the fastening torque presses the lid portion 24, a portion pressed by the end surface 37 of the main terminal 60 receives higher pressure than a portion pressed by the flat surface 36 of the side surface portion 35 of the main terminal 60. According to the present example, because the thick portion 84b, which is a portion pressed by the end surface 37 of the main terminal 60, is thicker than the thick portion 84a, the intensity of the lid portion 24 can be increased in accordance with the strength of the pressure received.

Figure 14:
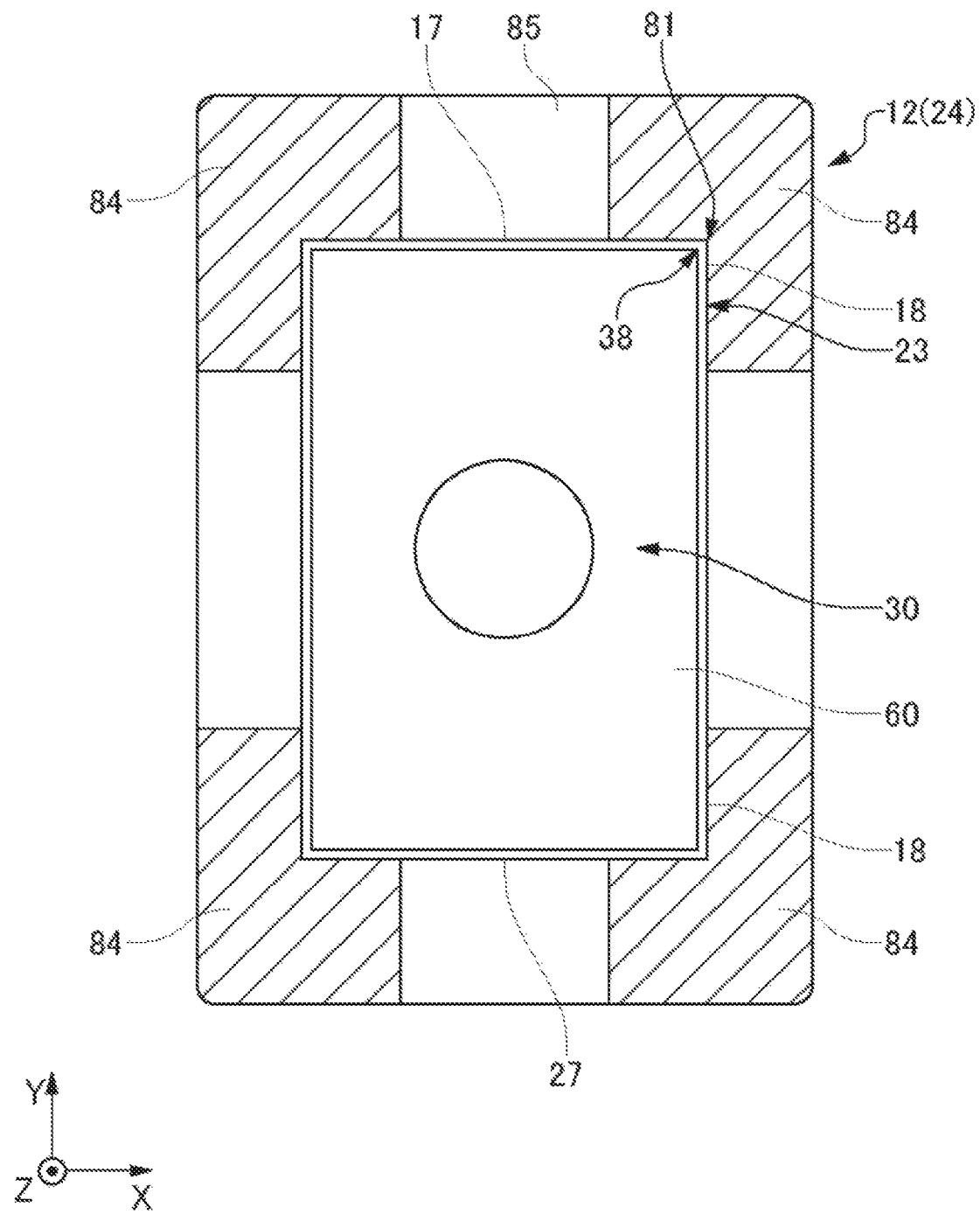
FIG. 14 shows a modification example of a semiconductor device 100 not having slit portions 82.

FIG. 14 shows a modification example of a semiconductor device 100 not having slit portions 82. Although in the above-described example, the semiconductor device 100 including the slit portion 82 and the thick portion 84 together has been described, the present invention is not limited to this case. The semiconductor device may be a configuration including at least one of the slit portion 82 and the thick portion 84. In the example shown in FIG. 14, the semiconductor device includes thick portions 84, while it does not include slit portions 82.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

EXPLANATION OF REFERENCES

10: casing portion; 12: main terminal arrangement portion; 13: control terminal arrangement portion; 14: through hole; 16: bottom portion; 17: first side; 18: second side; 20: substrate; 22: electronic circuit; 23: opening for terminal; 24: lid portion; 25: opening; 27: end surface facing portion; 28: joint portion; 29: terminal end; 30: principal surface portion; 31: through hole; 32: foot portion; 33: extending portion; 34: fixing portion; 35: side surface portion; 36: flat surface; 37: end surface; 38: corner; 40: control terminal; 50: insertion portion; 51: locking portion; 52: depression; 53: front surface; 55: principal surface facing portion; 60: main terminal; 81: corner portion; 82: slit portion; 84: thick portion; 85: middle portion; 86: curve; 87: connection portion; 92: protruding portion; 93: center line; 94: slit portion center line; 100: semiconductor device

What is claimed is:

1. A semiconductor device comprising:
a terminal portion in which a through hole is formed on a principal surface portion; and
a casing portion in which an opening to make the principal surface portion of the terminal portion exposed is provided, wherein
the opening has a corner portion corresponding to a corner of the principal surface portion of the terminal portion, and
the casing portion has a thick portion, in which thickness of a resin in a direction that is perpendicular to the principal surface is greater than that of a middle portion between adjacent corner portions across two sides forming the corner portion, in a surrounding area of the opening.

2. The semiconductor device according to claim 1, wherein
the casing portion has:
a bottom portion on which a semiconductor chip is mounted and the terminal portion is fixed,
a lid portion which covers at least a part of the bottom portion, the lid portion in which the opening to make the principal surface portion of the terminal portion exposed is provided, and
an insertion portion which is inserted between the principal surface portion of the terminal portion and the bottom portion in the opening of the lid portion, and includes a fitting surface in which a depression is provided at a position facing the through hole of the terminal portion, and
the lid portion includes the thick portion in which thickness of a resin is greater than that of a middle portion between adjacent corner portions across two sides forming the corner portion.

3. The semiconductor device according to claim 1, wherein
four corner portions are provided in the opening, and the thick portion is formed in each corner portion.

4. The semiconductor device according to claim 1, wherein
in the casing portion, a slit portion which extends outward from the corner portion is formed, and
at least a part of an outline of the slit portion as viewed from an upper surface direction of the casing portion is curved.

5. The semiconductor device according to claim 4, wherein
a connecting portion between the slit portion and a side of the opening may be curved as viewed from the upper surface direction.

6. The semiconductor device according to claim 4, wherein
a center line of the slit portion is biased clockwise relative to a center line of the corresponding corner portion.

7. The semiconductor device according to claim 2, wherein
the terminal portion has a pair of side surface portions which extends from a principal surface portion toward a bottom portion of the casing portion, and
the lid portion has a protruding portion which is provided so as to face a side surface portion of the terminal portion and extends toward a bottom portion of the casing portion.

8. The semiconductor device according to claim 7, wherein
the protruding portion is formed at a position biased toward the corner portion compared with a center line of the side surface portion.

9. The semiconductor device according to claim 8, wherein
in a corner portion on the side where the protruding portion is formed, in the casing portion, a slit portion which extends outward from the corner portion is formed.

10. The semiconductor device according to claim 8, wherein
the protruding portion is formed in at least one corner portion among a plurality of corner portions, in the casing portion, and
a slit portion which extends outward from the corner portion is formed in each of the plurality of corner portions.

11. The semiconductor device according to claim 2, wherein
> the terminal portion has a pair of side surface portions which extends from the principal surface portion toward the bottom portion of the casing portion, and
> in the thick portion, a portion facing an end surface of the terminal portion is thicker than a portion facing a flat surface of the side surface portion.

12. The semiconductor device according to claim 2, wherein
> the terminal portion has:
>> a pair of side surface portions which extends from the principal surface portion toward the bottom portion of the casing portion, and
>> a pair of foot portions which is coupled to respective side surface portions, and is connected to the bottom portion of the casing portion, wherein
>
> a position of a line connecting two connection points where the pair of foot portions is fixed to the bottom portion as viewed from an upper surface direction of the casing portion is shifted from a position of the through hole.

13. The semiconductor device according to claim 1, wherein
> the thick portion forms an outermost side of the opening.

* * * * *